United States Patent [19]
Endriz

[11] Patent Number: 5,515,391
[45] Date of Patent: May 7, 1996

[54] THERMALLY BALANCED DIODE LASER PACKAGE

[75] Inventor: John Endriz, Belmont, Calif.

[73] Assignee: SDL, Inc., San Jose, Calif.

[21] Appl. No.: 207,285

[22] Filed: Mar. 7, 1994

[51] Int. Cl.$^6$ .............. H01S 3/093; H01S 3/133; H01S 3/18

[52] U.S. Cl. .................. 372/34; 372/50; 372/29

[58] Field of Search .................. 372/70, 32, 34, 372/36, 35, 43, 44, 50, 29

[56] References Cited

U.S. PATENT DOCUMENTS

| | | | |
|---|---|---|---|
| 5,042,046 | 8/1991 | Sagawa et al. | 372/50 |
| 5,105,429 | 4/1992 | Mundinger et al. | 372/36 |
| 5,140,605 | 8/1992 | Paoli et al. | 372/50 |
| 5,270,870 | 12/1993 | O'Brien et al. | 372/36 |
| 5,345,459 | 9/1994 | Richardson, Jr. | 372/34 |

FOREIGN PATENT DOCUMENTS

| | | | |
|---|---|---|---|
| 0112789 | 9/1981 | Japan . | |
| 0073584 | 4/1988 | Japan | 372/36 |
| 0048477 | 3/1991 | Japan | 372/34 |
| 4115585 | 4/1992 | Japan . | |
| 5283815 | 10/1993 | Japan | 372/43 |
| 0204292 | 11/1994 | Japan | 372/34 |

Primary Examiner—Rodney B. Bovernick
Assistant Examiner—Robert McNutt
Attorney, Agent, or Firm—Schneck & McHugh

[57] ABSTRACT

A laser diode package incorporating a first laser diode (or diode laser array) for providing a modulated light output and a second laser diode (or diode laser array) with substantially similar thermal operating characteristics which is modulated with a complementary current signal relative to the modulated current signal driving the first laser diode. The two laser diodes are mounted in close proximity to one another on a temperature controlled heat sink. For diode laser arrays, slots are provided in the heat sink between adjacent array elements. The complementary modulation of corresponding elements in each laser diode ensures that the combined heat generation by each such corresponding pair of elements is constant in time. In the case of digital modulation, the driver logic and current drivers providing the complementary modulation signals may be a modulation controlled switch routing a constant current to one or the other of each corresponding pair of laser elements.

6 Claims, 5 Drawing Sheets

THERMALLY BALANCED DIODE LASER PACKAGE

TECHNICAL FIELD

The present invention relates to temperature control of analog or digitally intensity-modulated semiconductor lasers and diode laser arrays, and in particular, relates to compensation of thermal variations which arise as pump current injection across the active semiconductor diode junctions is varied to produce the modulated output.

BACKGROUND ART

In semiconductor laser diodes, including monolithic integrated diode laser arrays, such as laser bars, temperature changes at the active diode junction can result in significant changes in optical output power. Such temperature changes are typically caused by self-heating of a lasing element or crosstalk heating between adjacent lasing elements in an array. Laser diodes have output power sensitivities that typically range from 0.3%/°C. to 0.7%/°C. for constant current operation. This means that a mere 10° C. change in junction temperature can result in a 3% to 7% change in optical output power. Diode laser packages are usually provided, therefore, with thermoelectric coolers that act as heat pumps in order to approximately maintain a constant junction temperature.

Semiconductor laser diodes, especially laser bars, are increasingly used in laser printers, film recorders and other marking or imaging applications. This requires that the laser diodes be modulated in accord with the image to be written. The light emitting elements in such modulated lasers can have outputs which range in power from tens of milliwatts to several watts. Alternatively, digital modulation to fixed power levels may be used, where the digital signals are arbitrary and effectively random. In some instances, laser bars combining ten to twenty separately addressable elements in an array are used with peak modulated outputs on the order of one or more watts per element. At these power levels, the laser diode junction temperature rise relative to the ambient temperature can range from 5 or 10° C. to as much as 20° C. with most thermal management schemes of practical interest. In the case of imaging or marking applications, the essentially random, image dependent modulation of the laser elements creates thermal uncertainties of 10° C. or more and thereby results in unacceptable uncertainties of 3 to 7% or more in optical output from these elements. This uncertainty will produce imaging errors when the laser output is calibrated only to drive current.

It is possible, in principle, to use computer software to compensate for thermal variations based on a laser element's recent modulation history, adjusting the laser element's drive current accordingly. However, this approach is often not practical since modulation rates may extend into the megahertz ranges, and in an imaging application, the modulation history may need to be tracked over time periods of several seconds. Thus, this electrical compensation technique would be very complex. Additionally, in the case of separately addressable arrays, the software would need to account for cross-element heat spreading or 'thermal crosstalk' by factoring in heat contributions due to the independent modulation histories of adjacent laser elements of the array.

Laser bars with separately addressable lasing elements present yet another problem related to heating, namely misalignments between the multiple lasing elements of the laser bar and a microlens array used to image the array of emitted light beam, which are caused primarily by thermal expansion of the bar. Preferably, the lens registration variance should not exceed a few tenths of a micrometer, despite the non-uniform heating of the laser bar caused by the vastly different drive signals applied independently to each of the separate lasing elements in the bar. However, while a single thermoelectric cooler will lower the average junction temperature for the laser bar by simultaneously cooling all of the lasing elements in the array collectively, it will not reduce the temperature differential between 'on' and 'off' elements across the array. In fact, because the single thermoelectric cooler in acting as a heat pump presents a very high incremental thermal impedance to the individual laser elements (high cooling is not the same as low thermal impedance), the cooler will actually increase the temperature differential, while lowering the average temperature by lowering the temperature of the 'off' elements by a larger amount than the 'on' elements. The result is a source-to-lens registration that exceeds the preferred tolerances. This effect can be counteracted only by allowing cross-element heat spreading prior to reaching the thermoelectric (or other) cooler, in effect causing substantial interelement thermal crosstalk.

Multiple individually controlled thermoelectric coolers might be used, but this runs into some of the same complexity problems as the software compensation techniques referred to above. Further, due to their high thermal impedance, thermoelectric coolers, while able to suppress changes in temperature over relatively long time periods (about 0.1 second or longer), are not able to suppress the self-heating and cross-talk heating that occurs over shorter time periods (about 0.1 second or less). Such short period heating is a major contributor to interelement temperature differential.

Accordingly, it is an object of the invention to provide a temperature control scheme to reduce the temperature variations over time associated with the random nature of the signal driving a laser element's modulation and also to reduce the temperature variations across a laser bar that occur over shorter time periods.

SUMMARY OF THE INVENTION

The object is met with a laser diode package incorporating a thermal load in close proximity to the package's light emitting laser diode. While one driver provides a modulated current signal to the laser diode to produce the desired modulated optical output, another driver provides a complimentary modulated current signal to the thermal load so that the combined heat generation by both the current modulated laser diode and thermal load is substantially constant in time.

The thermal load may be another laser diode with operating thermal characteristics similar to that of the first 'signal' diode, except that the optical output from the second laser diode used as the thermal load is generally not used and is simply discarded. For digital modulation, the drivers can be provided their respective current signals via a modulation signal controlled switch. When the light emitting element in the laser diode providing the optical output is 'on', the corresponding element in the load is 'off' and vice versa For analog modulation, the driver circuitry ensures that the sum of the two currents is constant. The laser diode and load can be laser bars with monolithic arrays of separately addressable lasing elements, where each element in the bar providing the light output is in close proximity to a corresponding element in the load and where arrays of current drivers in the driver circuitry ensure that the sums of the currents provided to corresponding elements in the signal bar and load bar are constant.

Thus, instead of trying to remove heat in a non-uniform manner with multiple separately controlled thermoelectric coolers (or other cooling schemes) or adjusting the drive current to compensate for modulation history-dependent variations in temperatures, heat is removed uniformly by a single cooler, but additional heat is added by a thermal load that is driven by current signals that are complimentary to the modulation signals supplied at the same time to the light emitting elements of the laser diode array, thus balancing the laser diode's heat generation.

BEST MODE OF CARRYING OUT THE INVENTION

Figure 1:
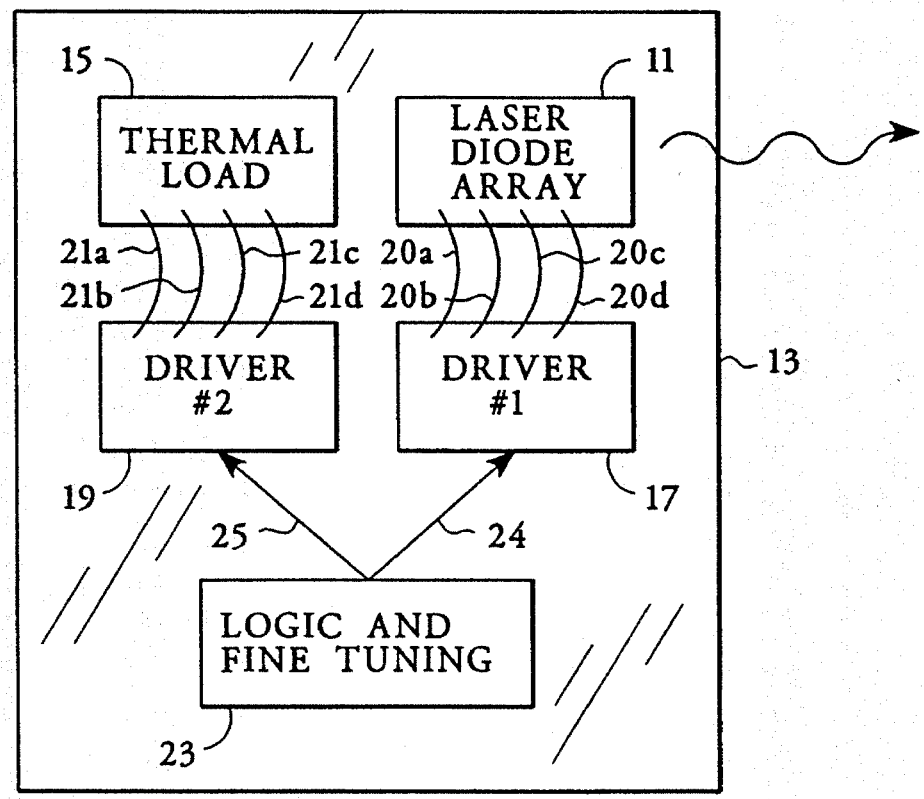
FIG. 1 is a schematic block diagram of a laser diode package of the present invention.

With reference to FIG. 1, a laser diode package of the present invention includes a laser diode, preferably in the form of a monolithic integrated laser diode array 11 with individually addressable lasing elements, mounted on a heat sink 13, preferably one which is thermoelectrically cooled. However, any controlled cooling scheme, such as water cooling, may be used. A thermal load 15, preferably another laser diode array with individually addressable elements corresponding to the lasing elements in laser diode array 11 and having substantially similar operating thermal characteristics as the laser diode array 11, is also mounted on the heat sink 13. The thermal load 15 might also be a set of resistors with substantially the same heat dissipation as the lasing elements of the laser diode array 11. Drivers 17 and 19 provide electric current carrying modulation signals to the respective elements of the laser diode array 11 and thermal load 15 via conductive leads 20a–d and 21a–d. The lasing elements of the laser diode array 11 receive the individual modulated current signals from respective leads 20a–d and produce modulated optical outputs in response to those signals. The elements of the thermal load receive complementary modulated current signals from respective leads 21a–d which correspond to the signals supplied to the laser diode array 11. In particular, the complementary signal supplied in lead 21a corresponds to the signal supplied on the lead 20a, etc. The relationship between the corresponding signals is such that the combined heat generation by each element of the laser diode array 11 and the corresponding element of the thermal load 15 is substantially constant in time. Accordingly, the laser diode package also includes logic and fine tuning circuitry 23 to generate the modulated signals and their complements and to deliver them over lines 24 and 25 to their respective drivers 17 and 19.

Figure 2:
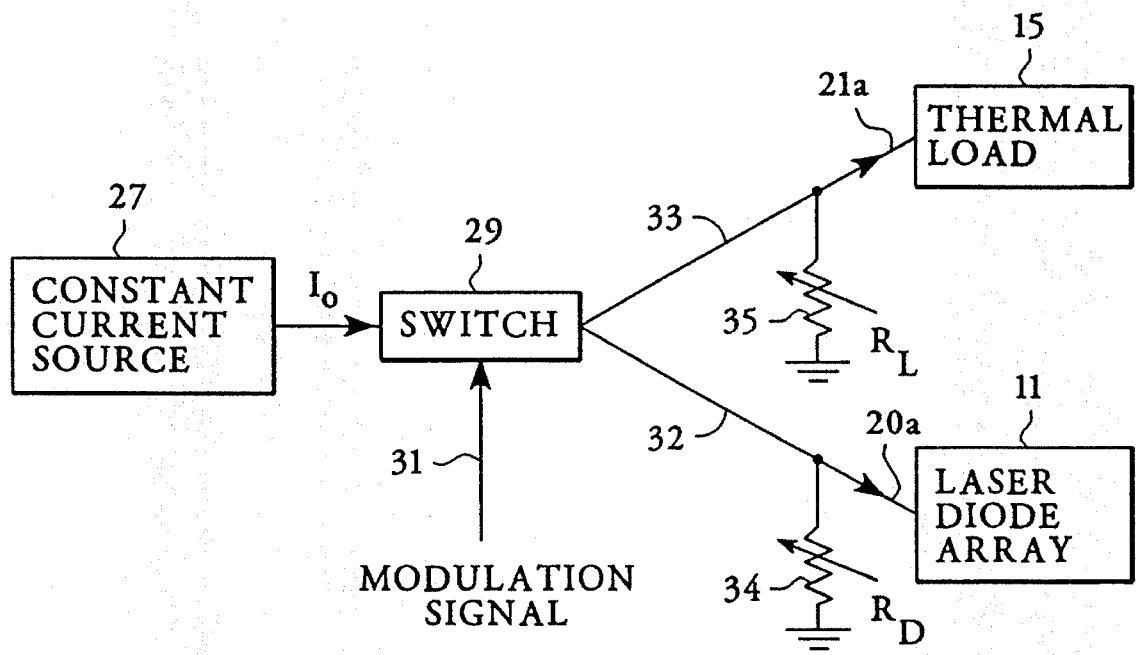
FIG. 2 is a schematic block diagram of logic and fine tuning circuitry for drivers in the laser diode package of FIG. 1.

With reference to FIG. 2, one such logic and fine tuning circuit and driver combination for use with digital modulation of the laser diode array 11 is shown. A constant current source 27 provides constant current $I_o$ to a switch 29. Switch 29 has a control input 31 receiving a digital modulation signal. Depending on the digital signal value of the modulation signal, the switch 29 routes the constant current $I_o$ onto either line 32 or line 33. Either or both of the lines 32 and 33 have shunt resistors $R_D$ and $R_L$, respectively, to ground. Either or both of these shunt resistors $R_D$ or $R_L$ is a variable resistor that can be trimmed to adjust the relative amount of current supplied over leads 20a and 21a to the respective elements of the laser diode array 11 and thermal load 15. Such adjustments are generally needed to compensate for slight differences in the operating thermal characteristics of the laser diode array 11 and thermal load 15. For example, two laser diode arrays rarely perform exactly the same, and so even when the thermal load 15 is another laser diode array with substantially similar operating characteristics as the laser diode array 11, fine adjustments in the current supply may be needed to ensure substantially the same thermal performance, i.e., equal power dissipation, by the two devices. Each lasing element of the laser diode array 11, together with the corresponding element of the thermal load 15, will have its own modulation signal-controlled switch 29 and its own shunt resistor or resistors 34 and 35.

In this digital modulation configuration, the switch circuitry provides a current pulse to one and only one of the corresponding pair of laser diode arrays and thermal load elements. Thus, at any given time, for each element in laser diode array 11 which is 'on', the corresponding element in the thermal load is 'off'. Likewise, for each element in the laser diode array 11 which is 'off' the corresponding element in the thermal load is 'on'. While elements in the laser diode array are being switched from 'off' to 'on', or vice versa, the corresponding elements in the thermal load are being switched from 'on' to 'off' or vice versa Thus, the combined heat generation by the corresponding pairs of elements is kept constant even though the lasing elements are being modulated between 'on' and 'off' states.

For analog modulation, circuitry that provides a balanced current output relative to some reference current value, such as a class-A push-pull amplifier circuit, can be used as the combination logic and driver circuitry to supply current to the laser diode array elements and corresponding thermal load elements. Using such circuitry, the sum of the corresponding drive currents supplied to respective elements of the laser diode array 11 and thermal load 15 is kept constant over time as the laser outputs are modulated.

Figure 2A:
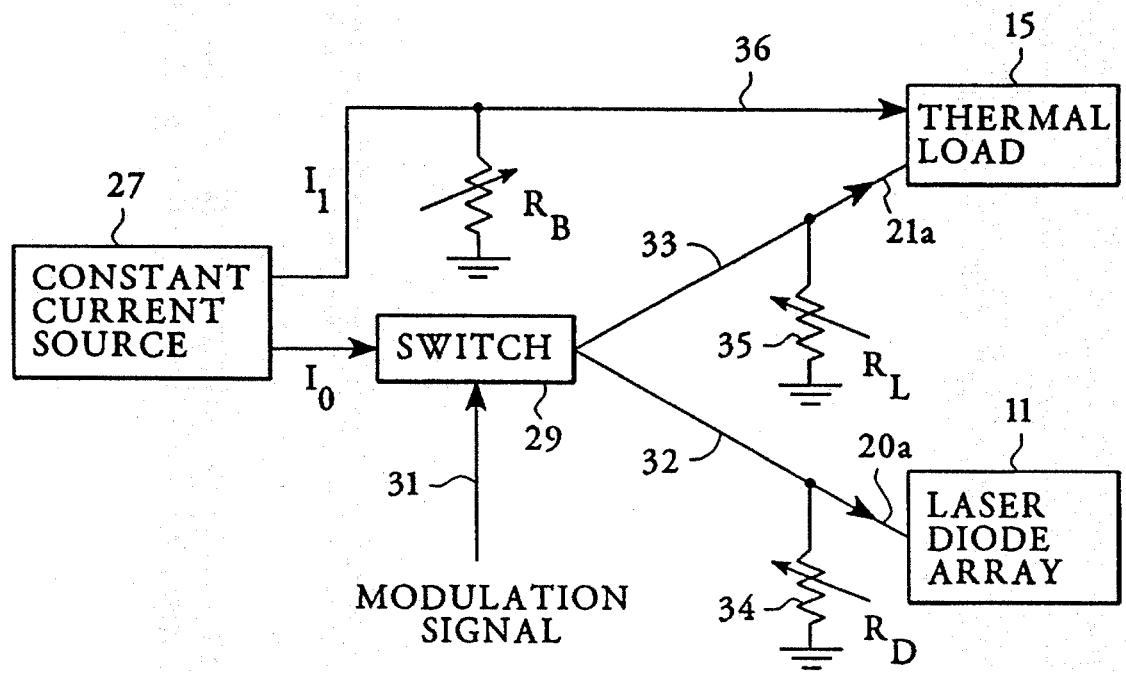
FIG. 2a is an alternate schematic block diagram of logic and fine tuning circuitry for drivers in the laser diode package of FIG. 1.

With reference to FIG. 2a, a circuit similar to FIG. 2 is shown, with identical components, except that the thermal load 15 is fed by a constant current $I_1$ which is adjusted by shunt resistor $R_B$. This variable resistor is used to adjust the bias current, $I_1$, which is fed to the thermal load 15 in parallel to current coming from switch 29 along line 33. The bias current supplied along line 36 to thermal load 15 compensates for temperature variability by introducing an offset bias temperature. The bias temperature for the thermal load, Q' is between 0.1 Q and 10 Q where Q is the a.c. temperature component derived from currents on lines 32 and 33 via switch 29. If the output wavelength of laser diode 11 is temperature dependent, the thermal bias in the thermal load 15 can be used to slightly adjust the output wavelength from the laser diode array 11. In this situation, the current $I_1$ from the constant current source 27 is selected to provide an appropriate amount of wavelength adjustment, in combination with current supplied from switch 29.

Figure 3:
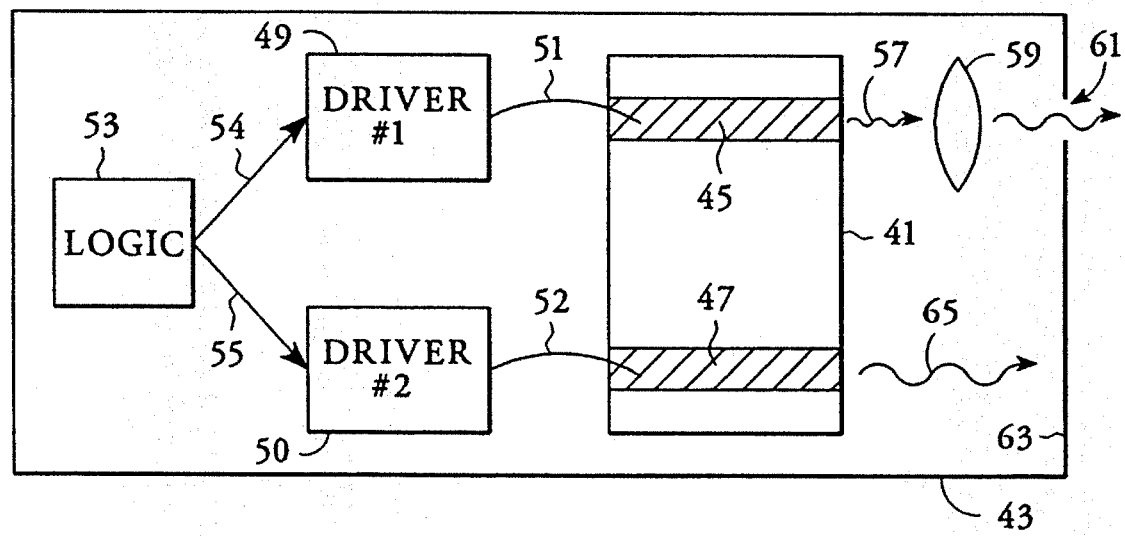
FIG. 3 is a schematic diagram of an alternative embodiment of a laser diode package of the present invention.

With reference to FIG. 3, an alternative laser diode package of the present invention has a monolithic laser diode array or bar 41 with both a modulated lasing element or elements 45 for providing a light output 57 and a like number of other lasing elements 47 serving as a thermal load, both mounted on the same active source. The laser diode array 41 is mounted on a heat sink, preferably one which is thermoelectrically cooled. Drivers 49 and 51 supply current to the light emitting element 45 and corresponding thermal load element 47 via conductive leads 51 and 52. The logic circuitry 53 provides the modulated current signal and complementary modulated current signal on lines 54 and 55 to the drivers 49 and 50.

The combination of logic circuitry 53 and drivers 49 and 50 can be like that shown in FIG. 2, employing a modulation signal-controlled switch 29 for routing a constant current $I_o$ to one and only one of the pair of elements 45 and 47 at any one time and also employing at least one shunt resistor 34 or 35 (or both) for adjusting the current to compensate for any differences in thermal characteristics of the two elements 45 and 47 of the array 41. If multiple pairs of light emitting and thermal load elements are present in the array 41, then each pair would have a separately controlled switch 29 and its own shunt resistor or resistors 34 (and 35). Analog modulation driver circuitry could also be used, as described above. Further, if multiple pairs of light emitting and thermal load elements are present on a laser diode array 43, each pair would be separated as much as possible from other pairs in order to minimize thermal crosstalk between pairs, while permitting thermal crosstalk between the light emitting element 45 and thermal load element 47 of each particular pair.

It should be noted that, in preferred embodiments, the thermal load element 47 is substantially identical to the light emitting element 45 and also produces laser emission 65 from the laser diode array 41. However, only the light 57 from the element designated as the light emitting element 45 is imaged, for example by a lens 59, and is allowed to exit the laser diode package, for example through an aperture 61. The light 65 from the element designated as the thermal load element 47 is blocked by the walls 63 of the laser diode package.

Figure 4:
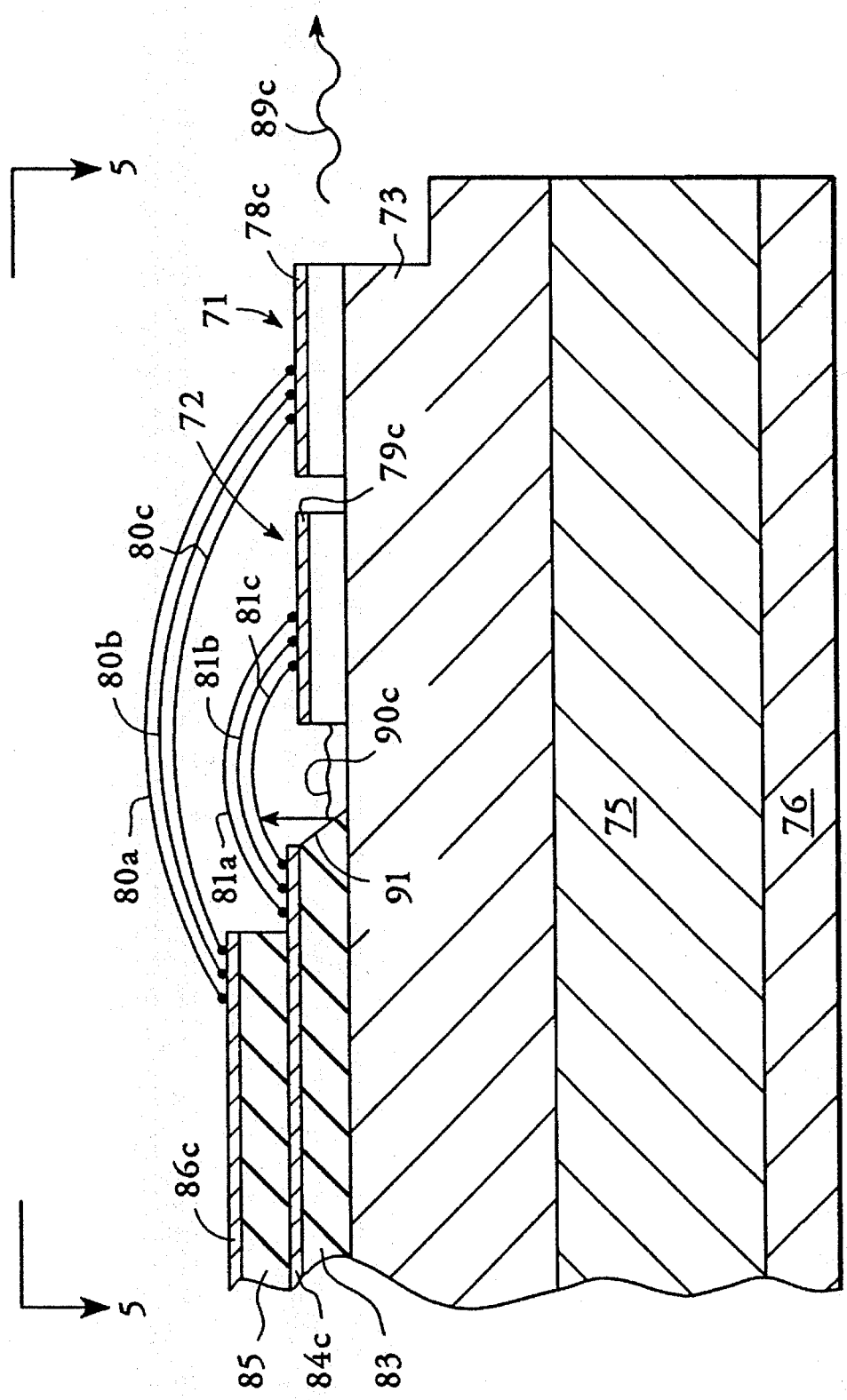
FIG. 4 is a side view of a laser diode package in accord with the embodiment of FIG. 1, where the diode array consists of a multiplicity of separately addressable elements on a monolithic laser diode bar.
Figure 5:
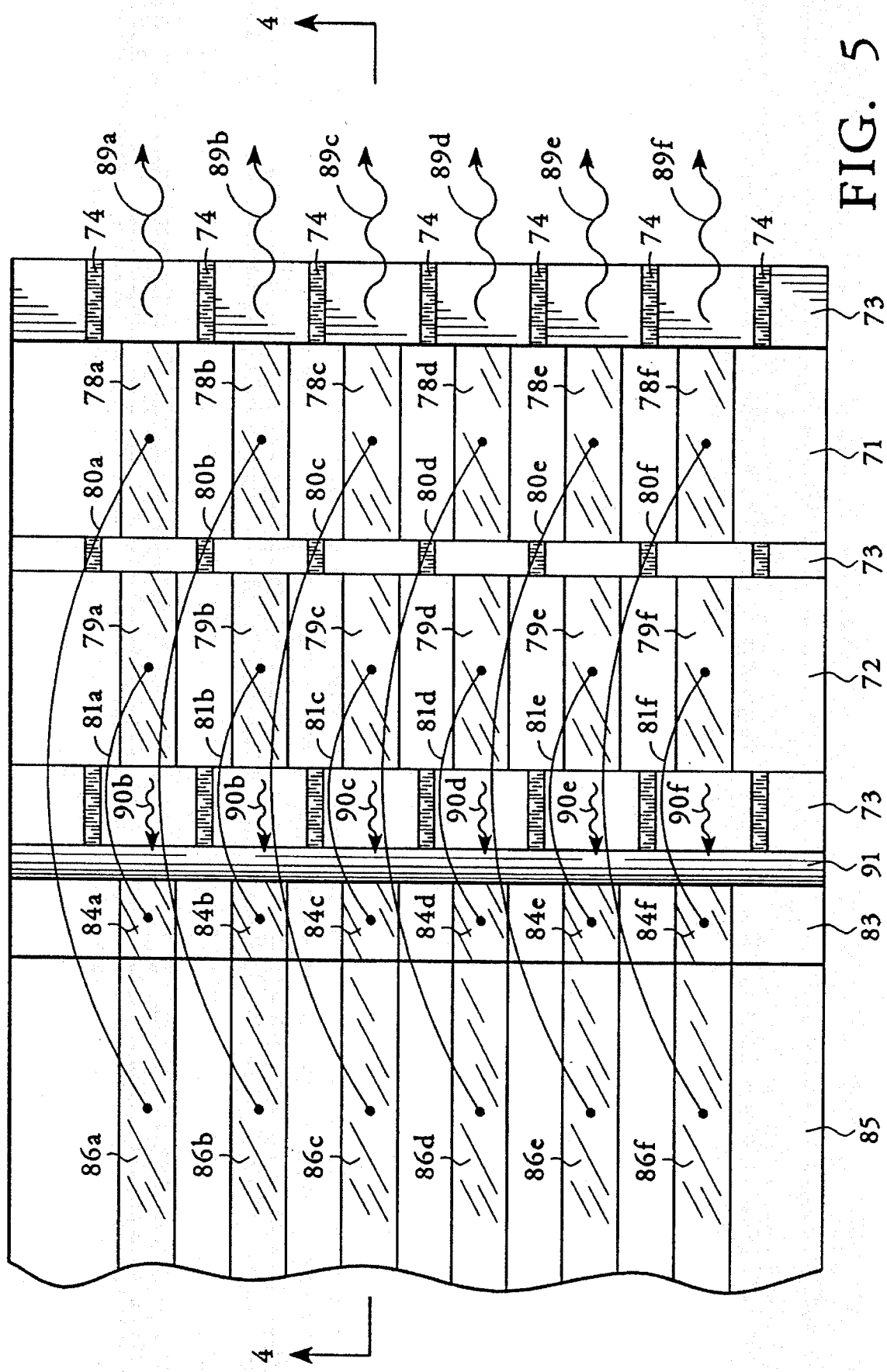
FIG. 5 is a top plan view of the laser diode package seen in FIG. 4. The relationship between the two views depicted in FIGS. 4 and 5 are indicated by the lines 5—5 in FIG. 4 and the lines 4—4 in FIG. 5.

With reference to FIGS. 4 and 5, both the laser diode array 71 providing the separately modulated light outputs 89a–f (the 'signal bar') and the laser diode array 72 acting as the thermal load (the 'load bar') are mounted on a heat sink 73 that is provided with parallel slots 74 in its surface which extend between the array elements of both bars. The slots 74 thermally separate the pairs of corresponding elements of the signal and load bars 71 and 72 from adjacent pairs of elements so as to minimize thermal crosstalk. However, the slots 74 allow thermal balancing among each pair of corresponding elements to ensure constant junction temperature under arbitrary modulation. The signal bar 71 and load bar 72 are generally separated by a distance of not more than 1.5 mm, and preferably this separation is less than 500 μm. A slot depth of more than 1.5 mm will ensure that by the point where the thermal pulses move beyond the slotted region into the larger heat spreader 75 underlying the slotted heat sink, the difference between the 'signal' and 'load' pulse will have largely disappeared. At that point, the heat generated by each corresponding pair of elements will have mixed sufficiently within each segmented heat sink region to provide a substantially constant thermal signal which is substantially equal to the thermal signal provided by every other segmented heat sink region. The heat spreader 75 is thus used to provide added thermal spreading in the dimension of the beam propagation so as to improve the effectiveness of the thermoelectric or other cooling scheme. The thermoelectric cooler 76 uniformly removes heat at a constant rate through the bottom of the heat spreader 75.

Each laser bar 71 and 72 has a plurality of separate, individually addressable, conductive contact stripes 78a–f and 79a–f, here each six in number but more typically ten to twenty in number, which are connected via conductive leads, 80a–f and 81a–f, to other conductive stripes, 84a–f and 86a–f, which connect to drivers, not shown. The drivers and logic circuitry may be like that described above for FIG. 2. The stripes 84a–f and 86a–f may be disposed on top of insulation layers 83 and 85 whose ends are staggered to form a terraced platform for making contact with the conduction leads 80a–f and 81a–f.

Also shown in FIGS. 4 and 5 are the light beams 90a–f emitted by the thermal load bar 72. This light is directed backward toward the interior of the laser diode package and may be scattered or reflected upward by a sloped end 91 of the insulating support layer 83 for the stripes 84a–f. This light emitted by the load bar 72 is generally not used. Only the light 89a–f emitted from the signal bar 71 is imaged and emitted from the laser diode package.

Figure 6:
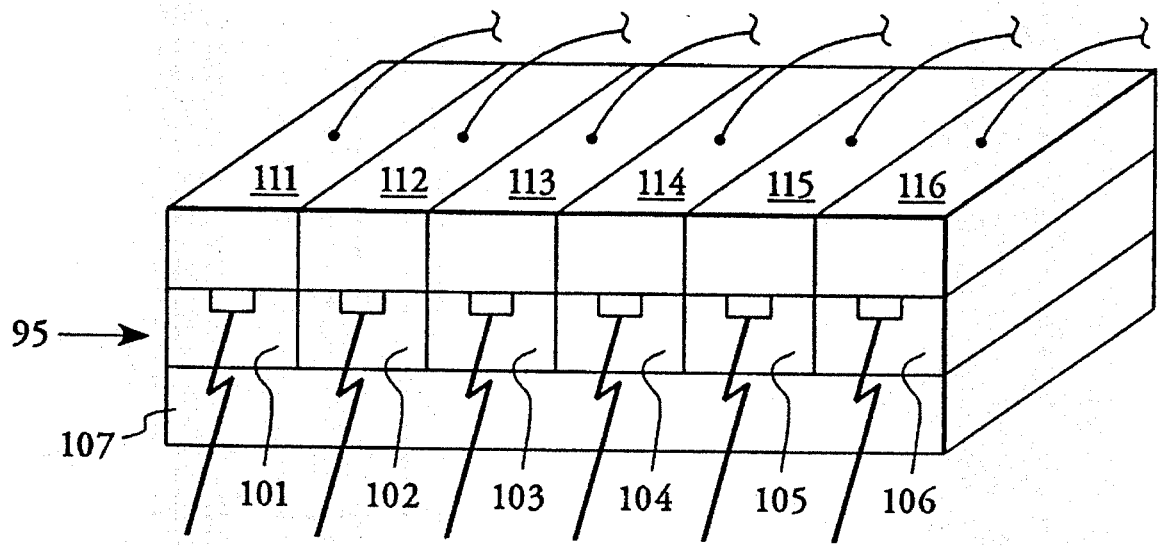
FIG. 6 is a perspective plan view of a laser diode array with individually addressable thermal load elements stacked on individually addressable elements of a diode laser array.

With reference to FIG. 6, a diode laser array 95 is seen to have individually addressable elements 101–106. The individual elements are part of a monolithic diode laser array mounted on a heat sink 107. Heat sink 107 may be a microchannel cooler or the like. A plurality of thermal load elements 111–116 are fabricated for direct bonding to the laser diode array 101, or fabricated as a part of a monolithic structure. As mentioned previously, the fabrication of the thermal load elements is identical to the diode laser elements, except that light output is blocked. By placing the thermal load elements in direct contact with individual laser diode elements, heat transfer is direct and cross-coupling is minimized. Also, with such close thermal coupling, it is possible to individually adjust the thermal d.c. bias current to the thermal load for adjusting the planarity of the light emitting region of each laser diode. This planarity, known as the "smile" needs to be adjusted to match lensing elements. Sometimes a lensing element may be misaligned by one or two microns. By adjusting the bias current to a thermal load element, the light emitting spot may be enlarged slightly to raise or lower the cone of light emitted by a diode laser element.

Figure 7:
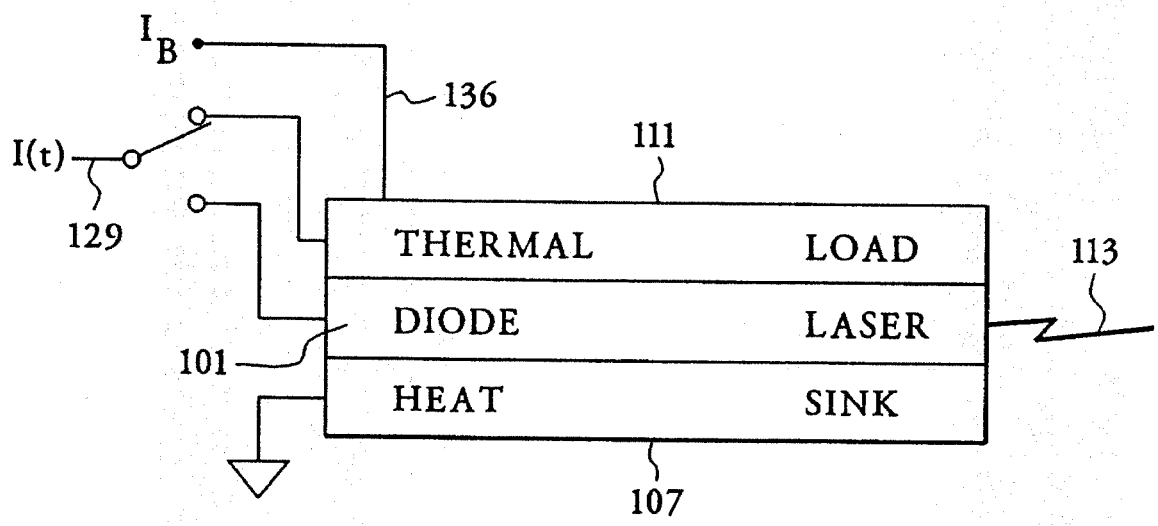
FIG. 7 is a side view of the stacked array shown in FIG. 6.

In FIG. 7, it may be seen that a modulation current I(t) is supplied through switch 129 to either thermal load element 111 or to diode laser element 101, as previously explained with reference to FIG. 2a. Bias current, $I_B$ is supplied along line 136 to the thermal load element 111. Each diode laser element has a separate corresponding thermal load element. In FIGS. 6 and 7 laser light is represented by jagged lines, such as line 113. The thermal bias arrangement of FIGS. 6 and 7 allows diode laser elements 101–106 to be biased at different temperatures so that individual laser wavelengths may be adjusted and one to two micron adjustments may be made in the planarity of an array or individual light emitting regions may be aligned with corresponding lensing elements.

I claim:

1. A diode laser array package comprising a heat sink submount, a first diode laser array mounted on said submount, said first diode laser array having a plurality of individually addressable laser elements for producing optical outputs, a second diode laser array mounted on said submount arranged back-to-back in tandem with said first diode laser array, said second diode laser array having a like plurality of individually addressable laser elements emitting light, each laser element of said second array being aligned in close proximity to a corresponding laser element of said first array, said laser elements of said first and second arrays having matched operating thermal characteristics, the laser elements of said second diode laser array forming heat generating thermal load elements for the corresponding laser elements of said first diode laser array, drive means for providing a separate modulated current signal to each laser element of said first diode laser array to produce separately modulated optical output beams from said first diode laser array and for providing to each laser element of said second diode laser array a modulated current signal that is complementary to the current signal provided to the corresponding laser element of the first array such that combined heat generation by each pair of corresponding laser elements from said first and second diode laser arrays is substantially constant in time.

2. The diode laser array package of claim 1 wherein said heat sink submount has thermal isolation slots formed lengthwise in a top submount surface underlying both said first and second diode laser arrays in positions between adjacent laser elements of each laser array, such that each pair of corresponding laser elements of the first and second arrays is thermally isolated from neighboring pairs of corresponding laser elements, but each laser element of said first diode laser array is maintained in thermal communication with the corresponding laser element of said second diode laser array.

3. The diode laser array of claim 2 wherein said thermal isolation slots have a depth in said top submount surface that is comparable to or greater than a separation distance between said corresponding laser elements of said first and second diode laser arrays.

4. The diode laser array package of claim 1 further comprising a temperature-controlled cooler mounted to a base of said submount opposite said diode laser arrays for uniformly removing heat generated by said diode laser arrays from said submount at a constant rate that is substantially equal to said combined heat generation of both arrays.

5. The package of claim 1 wherein said drive means includes a set of switches connected to a set of constant current sources, each switch also connected to one element in said first diode laser array and the corresponding element in said second diode laser array, each switch being responsive to a modulation signal so as to route current from said constant current source to one and only one of said corresponding elements in said first and second diode laser arrays.

6. A method for aligning the plane of output beams of a laser diode array of the type wherein individually addressable laser diode elements have output beams whose position may be slightly varied relative to lensing elements by changes in temperature comprising, for each separately addressable laser diode element, providing a separately addressable thermal bias element in close contact therewith, changing the bias in thermal bias elements of the array until said laser diode elements in contact therewith reside in a desired alignment relative to the lensing elements.

* * * * *